United States Patent

Watanabe

[11] Patent Number: 5,841,711
[45] Date of Patent: Nov. 24, 1998

[54] SEMICONDUCTOR MEMORY DEVICE WITH REDUNDANCY SWITCHING METHOD

[75] Inventor: Kazuo Watanabe, Tokyo, Japan

[73] Assignee: NEC Corporation, Tokyo, Japan

[21] Appl. No.: 918,668

[22] Filed: Aug. 28, 1997

[30] Foreign Application Priority Data

Aug. 30, 1996 [JP] Japan .................................. 8-229646

[51] Int. Cl.⁶ .............................. G11C 7/00; G11C 29/00
[52] U.S. Cl. ...................... 365/200; 365/201; 365/189.07
[58] Field of Search .................................. 365/200, 201, 365/189.07; 371/21.1, 21.2, 21.3, 10.2

[56] References Cited

U.S. PATENT DOCUMENTS 5,469,444  11/1995  Endoh et al. ........................ 365/201 X
5,566,113  10/1996  Saito et al. ............................... 365/201
5,642,317  6/1997  Furutani .................................... 365/201

FOREIGN PATENT DOCUMENTS

3-160697  7/1991  Japan .

*Primary Examiner*—Son Mai
*Attorney, Agent, or Firm*—Foley & Lardner

[57] ABSTRACT

A semiconductor memory device with a redundancy switching system is operable in first and second modes. In the first mode, data read from a memory element is compared with external data, and if the compared data do not agree with each other, an external address is latched. In the second mode, the latched external address is written into a redundancy switching nonvolatile memory element. The first and second modes are selected with the same signal for each memory chip.

6 Claims, 10 Drawing Sheets

FIG. 10 though they cannot be repaired, thenCODE circuit) 70, a sense amplifier 71, a Y decoder

SEMICONDUCTOR MEMORY DEVICE WITH REDUNDANCY SWITCHING METHOD

BACKGROUND OF THE INVENTION

1. Field of the Invention

The present invention relates to a semiconductor memory device, and more particularly to a semiconductor memory device with a redundancy switching method.

2. Description of the Related Art

A process of repairing a defective column line (bit line) in a conventional semiconductor memory device will be described below with reference to FIGS. 1 and 2 of the accompanying drawings.

Figure 1:
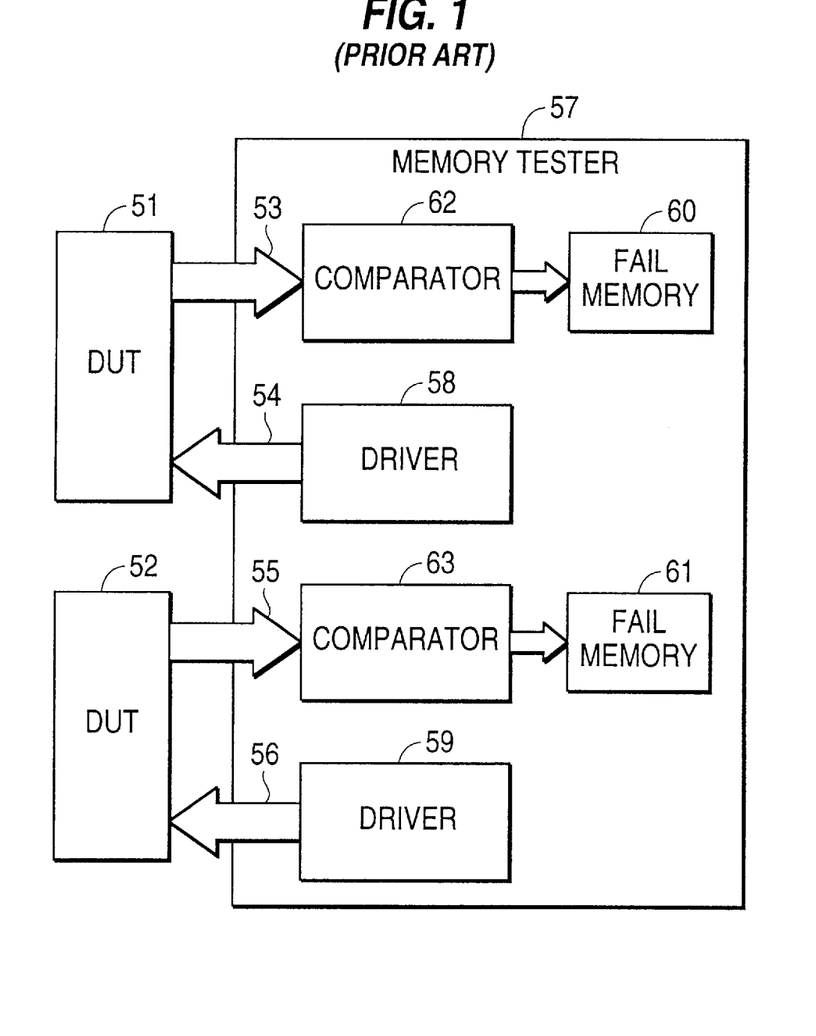
FIG. 1 is a block diagram of a conventional memory tester for testing a plurality of devices parallel to each other with a redundancy switching system.
Figure 2:
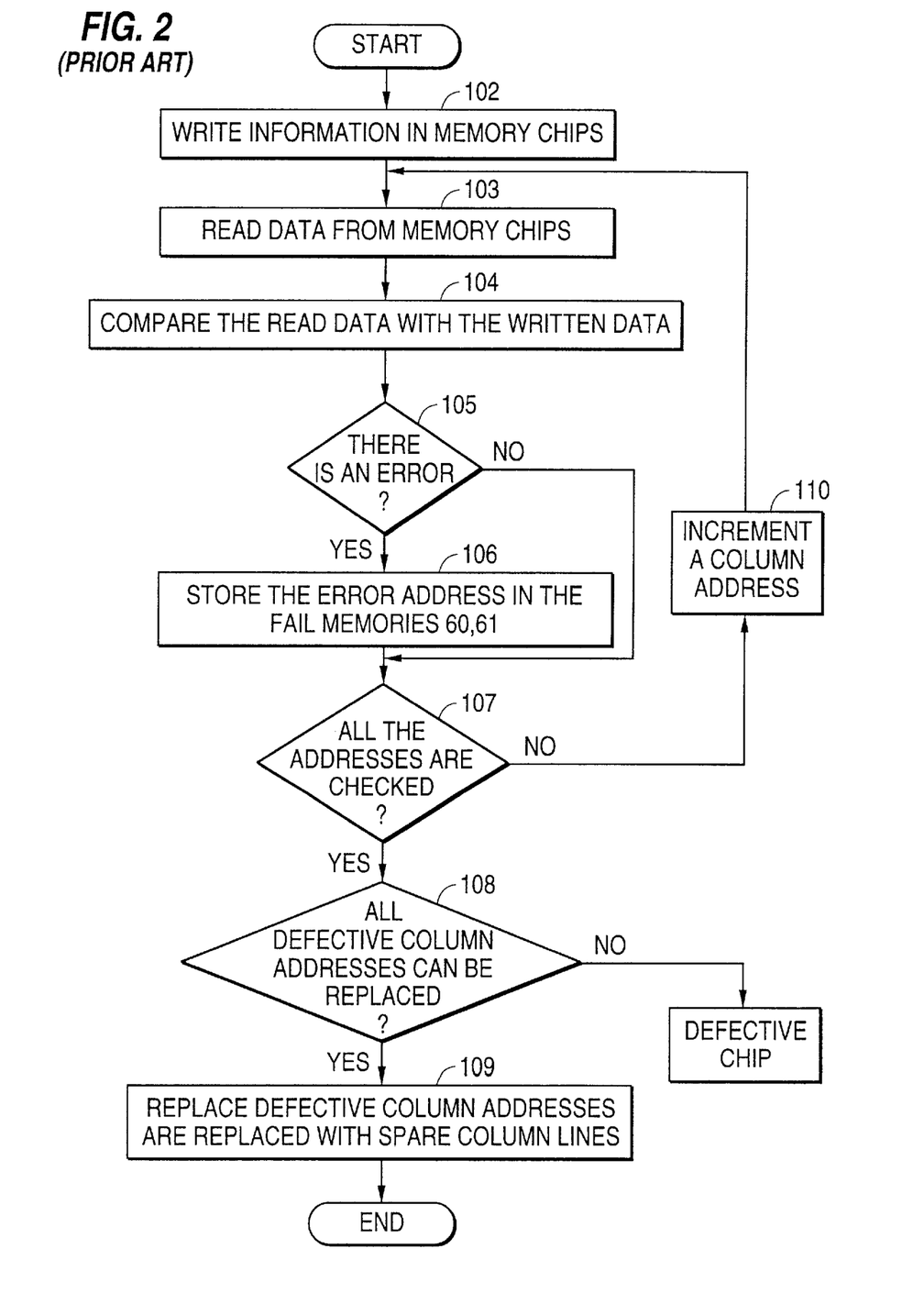
FIG. 2 is a flowchart of a testing procedure of the memory tester shown in FIG. 1.

As shown in FIG. 1, a memory tester 57 serves to test two devices (DUTs) 51, 52 parallel to each other. The memory tester 57 has drivers 58, 59 for energizing the devices 51, 52 respectively through address/control terminals 54, 56, fail memories 60, 61, and comparators 62, 63 for reading data from the devices 51, 52 through respective I/O terminals 53, 55, comparing the read data with data that have been written, and storing addresses into the fail memories 60, 61 if the read data is in error.

A procedure for testing the devices 51, 52 with the memory tester 57 shown in FIG. 1 will be described below with reference to FIG. 2.

Certain information (test pattern) is written in the devices 51, 52 (memory chips) in a step 102. Then, the data is read from the devices 51, 52 in a step 103. The comparators 62, 63 compare the read data and the data that has been written in steps 104, 105. If there is an error, then the address from which the error is read is stored into the fail memories 60, 61 in a step 106. In steps 107 and 110, the above cycle is repeated with respect to all addresses of the devices 51, 52. After all the addresses are checked for error, the tester 57 determines whether all defective column addresses (bit line) can be repaired or not in a step 108. If they can be repaired, then the tester 57 replaces them with spare column lines in a step 109. If they cannot be repaired, then the tester 57 judges the devices 51, 52 as defective memory chips. The above sequence is carried out for repairing defective word lines.

When two or more devices are to be tested by the memory tester 57, it is necessary to assign respective areas of the fail memories 60, 61 to the devices. Therefore, the fail memories 60, 61 need to have large storage capacities. As the number of devices to be tested increases, the storage capacities of the fail memories 60, 61 increase. In order to switch between redundant memory cells, it has heretofore been necessary to supply addresses from the address/control terminals 54, 56 for processing and switching the data read into the fail memories 60, 61. Signals supplied from the address/control terminals 54, 56 have been produced from the drivers 58, 59, and the addresses to be switched may not necessarily be in agreement with the signals from the address/control terminals 54, 56 (e.g., an address to be switched may be $700 whereas a signal from an address/control terminal may be $70). If this happens, further data processing will be needed.

Since addresses to be switched differ from sample to sample in the above address switching operation, the devices 51, 52 cannot be tested parallel to each other.

Figure 3:
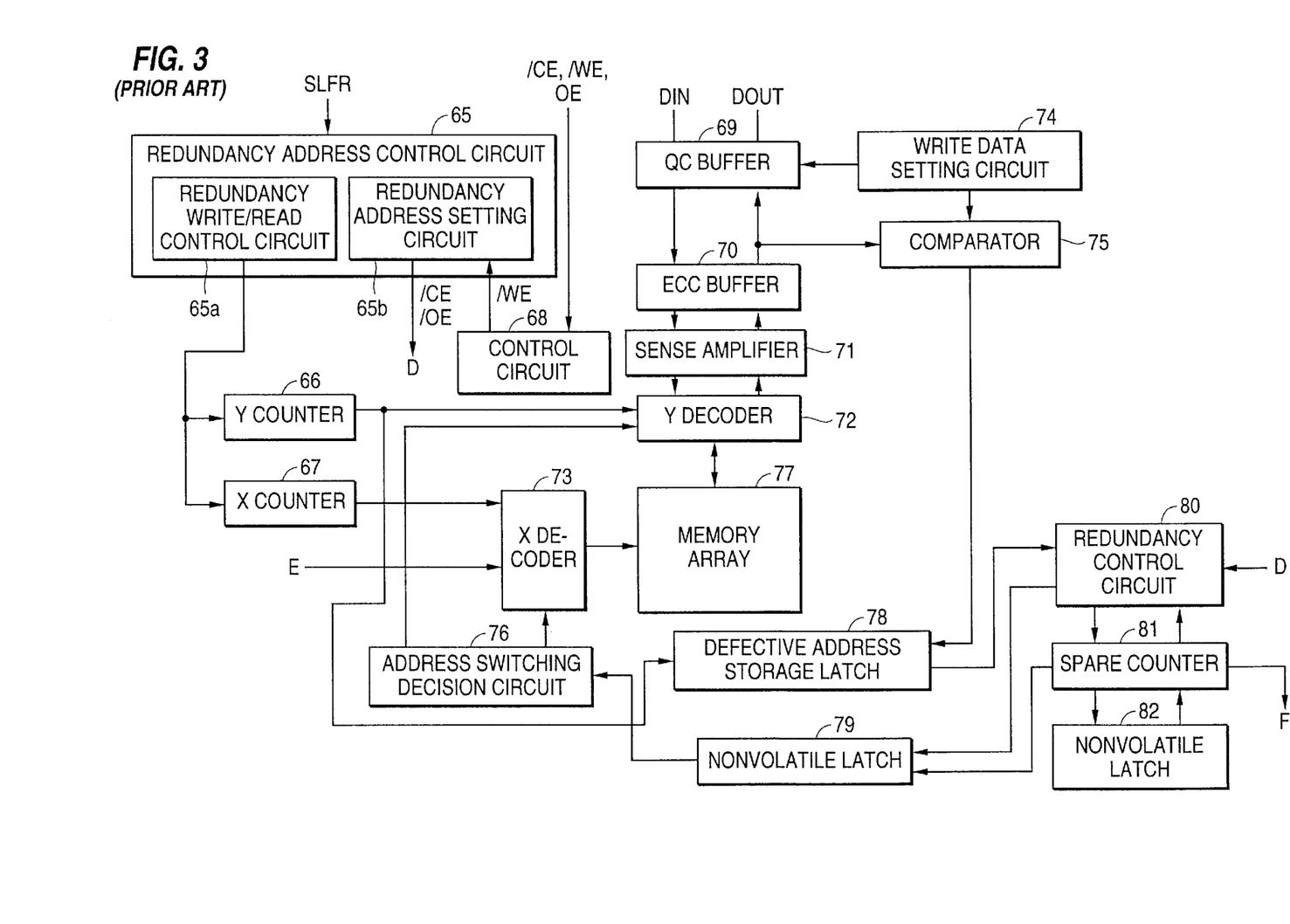
FIG. 3 is a block diagram of a semiconductor memory device disclosed in Japanese laid-open patent publication No. 6-131895.
Figure 4:
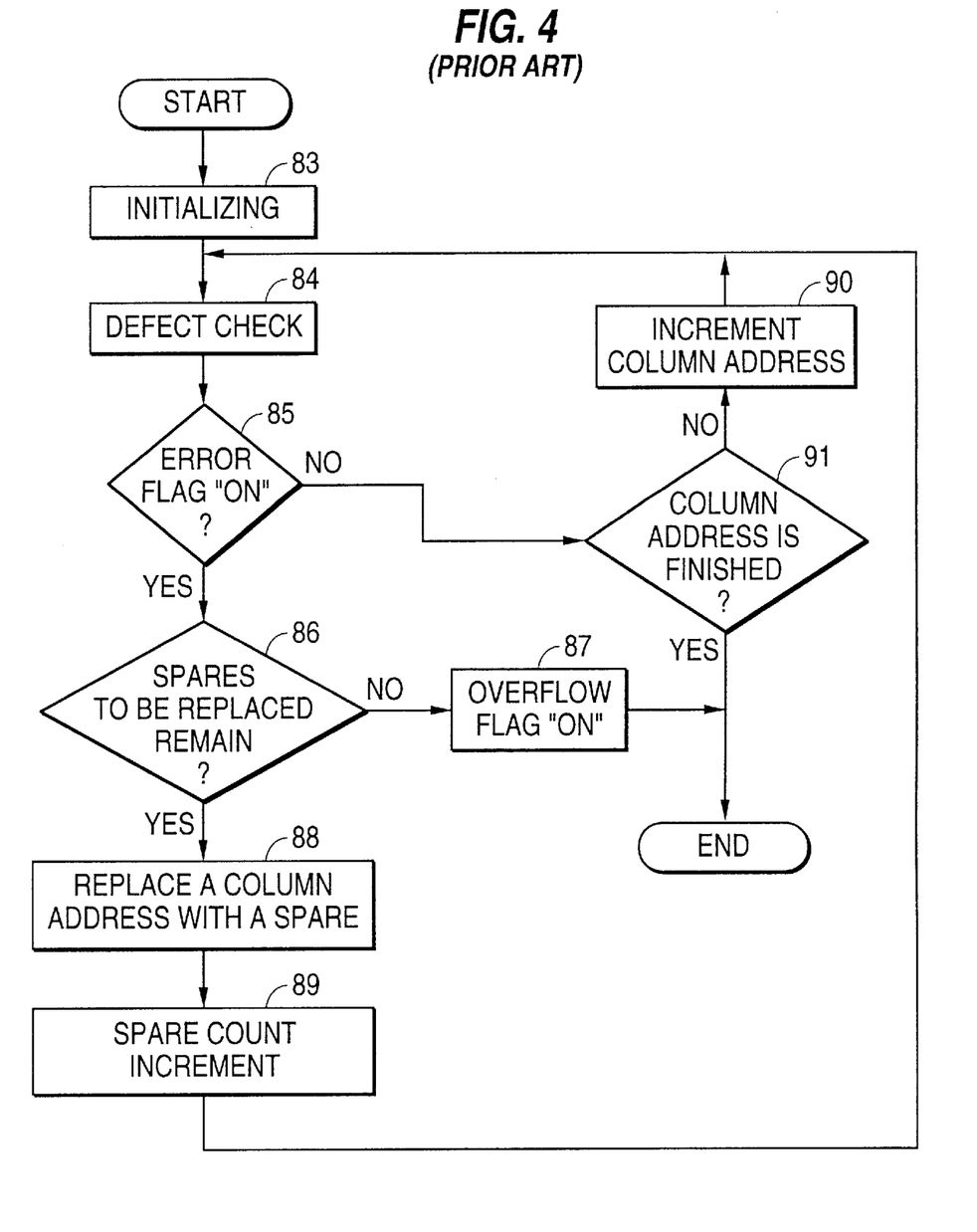
FIG. 4 is a flowchart of an operation sequence of the semiconductor memory device shown in FIG. 3.
Figure 5:
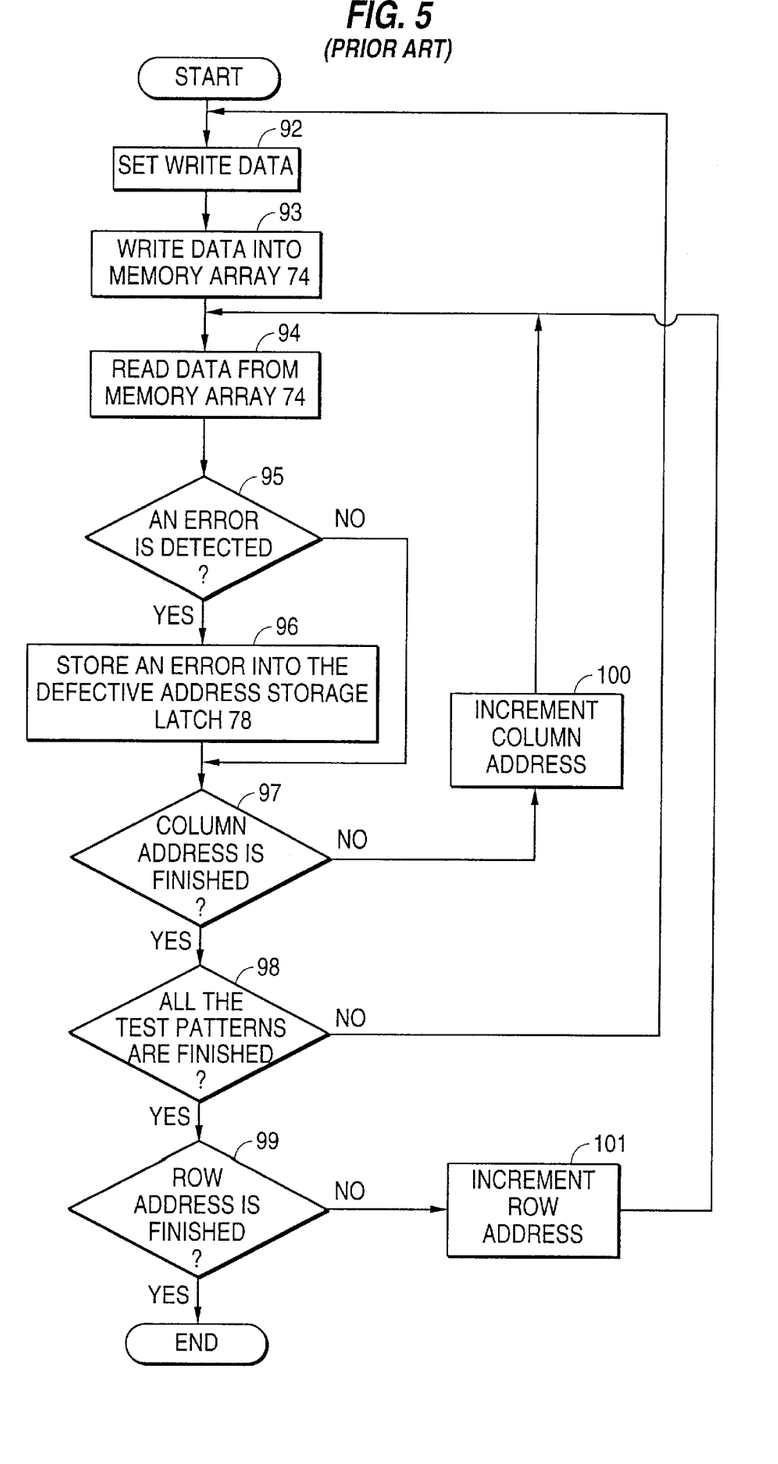
FIG. 5 is a flowchart of a detailed operation sequence of a defect checking step 84 of the operation sequence shown in FIG. 4.

One solution to the above problem is disclosed in Japanese laid-open patent publication No. 131895/94. FIG. 3 of the accompanying drawings shows in block form a disclosed semiconductor memory device. FIG. 4 of the accompanying drawings shows an operation sequence of the semiconductor memory device shown in FIG. 3. FIG. 5 of the accompanying drawings shows a detailed operation sequence of a defect checking step of the operation sequence shown in FIG. 4. The semiconductor memory device shown in FIG. 3 comprises a redundancy address control circuit 65 having a redundancy write/read control circuit 65a and a redundancy address setting circuit 65b, a Y counter 66, an X counter 67, a control circuit 68, a DQ buffer 69, an ECC (Error Correcting Code circuit) 70, a sense amplifier 71, a Y decoder 72, an X decoder 73, a write data setting circuit 74, a comparator 75, an address switching decision circuit 76, a memory array 77, a defective address storage latch 78, a nonvolatile latch 79, a redundancy control circuit 80, a spare counter 81, and a nonvolatile latch 82.

The redundancy write/read control circuit 65a generates control signals /CE, /WE, /OE when a self redundancy function (self test) is performed. When the self redundancy function (self test) is performed, the Y counter 66 generates a column address, and the X counter 67 generates a row address. When a column address is replaced, the nonvolatile latch 79 stores information about the replacement of the column address. The write data setting circuit 74 outputs write data for testing a memory chip to the DQ buffer 69 and the comparator 75. The comparator 75 compares the write data and read data with each other. The redundancy control circuit 80 generates a control signal for replacing a defective column address with a spare column address. The spare counter 81 counts the number of spare column addresses that have been used, and indicates a spare column address that can be used next. The nonvolatile latch 82 latches the information from the spare counter 81 in a nonvolatile manner. An SLFR signal supplied to the redundancy address control circuit 65 is a signal for starting the self redundancy function. The SLFR signal is generated by triggering the application of a voltage, which would not normally be applied, to an existing pin or triggering the application of a combination of signals, which would not normally be applied, to a plurality of existing pins. When the SLFR signal is supplied, the redundancy write/read control circuit 65a generates signals /CE, /WE, /OE required for writing and reading data, and supplies the generated signals to the control circuit 68. The defective address storage latch 78 stores defective column addresses. Since a nonvolatile semiconductor memory device which is capable of rewriting data in terms of words has to treat each word as one unit, the nonvolatile semiconductor memory device has columns each comprising a combination of a bit line corresponding to a word configuration and a control line for selecting and unselecting bit lines. The defective address (column address) storage latch 78 is assigned to each of the columns, and stores a defective column address if an address of the corresponding column is defective.

When the SLFR signal is supplied to the redundancy address control circuit 65, the self redundancy function is performed. Based on a pattern generated by the write data setting circuit 74, data is written into the memory array 77 in steps 92, 93 (FIG. 5). Thereafter, the data is read from the memory array 77 by addresses generated by the X counter 67 and the Y counter 66, and the comparator 75 determines whether the read data is in agreement with the pattern generated by the write data setting circuit 74. If an error is detected by the comparator 75, a column address associated with the error is latched in the defective address storage latch 78 in steps 94, 95, 96 (FIG. 5). The above operation is repeated with respect to all Y addresses while incrementing the Y counter 66. Then, while incrementing the X counter 67, an error is searched for with another test pattern in steps 97, 98, 100 (FIG. 5). If a memory cell on one column is judged as defective while checking all row addresses, then the column address is latched as a defective address.

Replacement of a column will be described below. In response to a replacement signal D from the redundancy address setting circuit 65b, the redundancy control circuit 80 starts replacing a column. The information stored in the defective address storage latch 78 is sent to the redundancy control circuit 80, which stores the data of the column address with respect to which an error has been detected, into the nonvolatile latch 79. Data about how spare column addresses have been used is stored in the nonvolatile latch 82. When the semiconductor memory device runs out of spare column addresses or the column addresses reach a final address, the self redundancy function comes to an end in steps 85, 86, 88, 89, 90, 91 (FIG. 4).

As described above, the semiconductor memory device has an address generating function, a write/read data setting function, and a function for controlling the writing and reading of data when the self redundancy function is performed. Therefore, the semiconductor memory device automatically replaces a defective memory cell with a redundant memory cell simply when the semiconductor memory device is supplied with a control signal for initiating the self redundancy function from an external circuit.

The above redundancy switching method in the conventional nonvolatile semiconductor memory device needs an increased amount of investments for the facility (tester) because of an increased storage capacity required for the fail memories of the tester when a plurality of devices are to be tested parallel to each other, and also because of the need to allocate faulty information of the devices being tested parallel to each other to the fail memories. The process of switching a defective memory cell to a redundant memory cell in a device under test needs a long period of time because it has to be carried out individually for each of defective memory cells, and greatly affects the cost of the memory chip. Furthermore, the conventional semiconductor memory device has been improved with respect to parallel testing and the increased storage capacity required for the fail memories, the area of the memory chip increases and the final cost of the memory chip is high because all the program required to switch defective memory cells to redundancy memory cells is installed in the memory chip.

SUMMARY OF THE INVENTION

It is an object of the present invention to provide a semiconductor memory device which will solve the foregoing problems of the tester and will not increase the area of the memory chip.

Another object of the present invention is to provide a semiconductor memory device which can efficiently be mass-produced with a redundancy switching system for a test, and which has a reduced memory chip area for a reduction in the memory chip cost.

To achieve the above objects, there is provided in accordance with the present invention a semiconductor memory device comprising a main memory array having memory elements for storing external data, a plurality redundant memory cells for replacing defects in the main memory array, reading means for reading a memory element of the main memory array which corresponds to an external address, comparing means for comparing data read from the memory element with external expected value data corresponding to the external address, latch means for latching information of a portion of the external address if the data read from the memory element and the external expected value data do not agree with each other, writing control means for writing the information of the portion of the external address latched by the latch means into nonvolatile memory elements, and means for reading data from a redundant memory cell if the external address and the address, written in the nonvolatile memory elements, to be replaced by the redundant memory cell agree with each other.

In a first mode of operation, an external address is supplied to an address terminal and expected value data corresponding to the address is supplied to a data input/output terminal. Data read from a main memory cell corresponding to the external address and the expected value data from the data input/output terminal are compared with each other. If the compared data do not agree with each other, then the address is latched by a latch circuit. In a second mode of operation, the address latched by the latch circuit is written into a redundancy switching nonvolatile memory element, thus replacing the main memory cell with a redundant memory cell. The first and second modes are selected by applying a high voltage to a certain terminal. In a normal write mode, after data is written, an address is searched for when a plurality of memory devices are tested parallel to each other. Thereafter, the second mode is selected to complete the redundancy switching. Since the first and second modes are selected with the same signal for each memory chip, it is not necessary to effect serial operation on each memory chip upon redundancy switching. Consequently, it is possible to test a plurality of memory devices with a tester that is free of fail memories. For testing a plurality of memory devices parallel to each other for redundancy switching therefor, the memory chip incorporates a minimum device which does not need an X counter, a Y counter, and a write data setting circuit, and hence has a minimum chip area.

The above and other objects, features, and advantages of the present invention will become apparent from the following description with references to the accompanying drawings which illustrate an example of the present invention.

DESCRIPTION OF THE PREFERRED EMBODIMENTS

Figure 6:
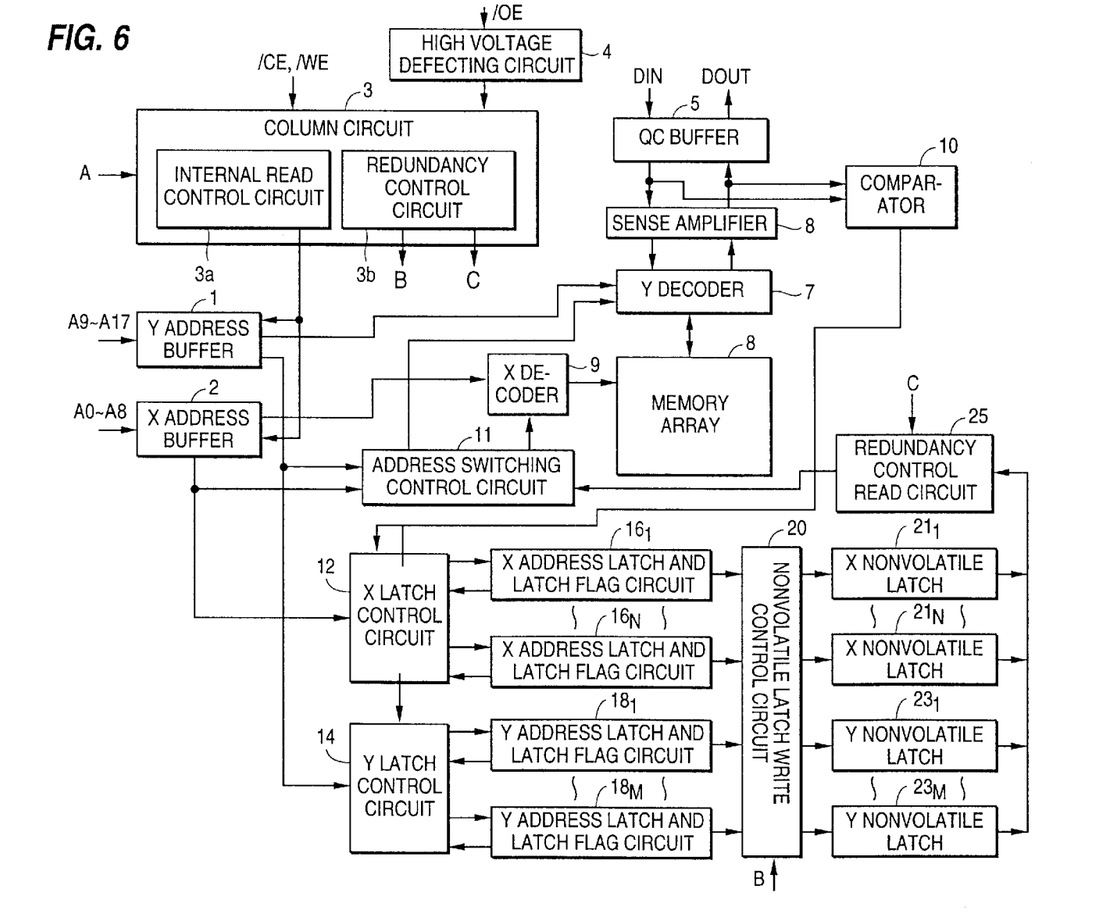
FIG. 6 is a block diagram of a semiconductor memory device according to a first embodiment of the present invention.

As shown in FIG. 6, a semiconductor memory device according to a first embodiment of the present invention comprises an Y address buffer 1, an X address buffer 2, a control circuit 3, a high-voltage detecting circuit 4, a DQ buffer 5, a sense amplifier 6, a Y decoder 7, a memory cell array 8, an X decoder 9, a comparator 10, an address switching decision circuit 11, an X latch control circuit 12, a Y latch control circuit 14, X address latches and latch flag circuits $16_1$~$16_N$, X address latches and latch flag circuits $18_1$~$18_M$, a nonvolatile latch write control circuit 20, X nonvolatile latches $21_1$~$21_N$, Y non-volatile latches $23_1$~$23_M$, and a redundancy control read circuit 25.

The Y address buffer 1 is supplied with external addresses A9~A17 and outputs an internal Y address signal. The X address buffer 2 is supplied with external addresses A0~A8 and outputs an internal X address signal. The high-voltage detecting circuit 4 is supplied with an external signal /OE and detects whether the level of the external signal /OE is of a high voltage or not. The control circuit 3 has an internal read control circuit 3a for being supplied with external signals /CE, /WE, an output signal from the high-voltage detecting circuit 4, and a first redundancy write control signal A, i.e., a signal for selecting the switching of X redundancy or the switching of Y redundancy, to control an internal read system, and a redundancy control circuit 3b for controlling the reading and writing of redundancy. The internal read control circuit 3a outputs an internal read control signal. The redundancy control circuit 3b outputs a second redundancy write control signal B, which is used as a control signal for writing an address to be replaced with a redundant memory into a nonvolatile memory element. The redundancy control circuit 3b also outputs a redundancy read control signal C, which is used as a control signal for reading an address to be replaced with a redundant memory from a nonvolatile memory element. The DQ buffer 5 receives an input signal from and transmits an output signal to external input and output terminals DIN, DOUT. The Y decoder 7 is supplied with an internal Y address and an output signal from the address switching decision circuit 11. The X decoder 9 is similarly supplied with an internal X address and an output signal from the address switching decision circuit 11. The sense amplifier 8 reads a memory cell selected by the Y decoder 7. The comparator 10 compares an output signal from the sense amplifier 8 and an output signal from the DQ buffer 5. The X latch control circuit 12 is supplied with an output signal from the comparator 10, an internal X address, and output signals indicative of the statuses of latch flags from the X address latches and latch flag circuits $16_1$~$16_N$. The Y latch control circuit 14 is supplied with an output signal from the comparator 10, an internal Y address, and output signals indicative of the statuses of latch flags from the Y address latches and latch flag circuits $18_1$~$18_M$.

Figure 7:
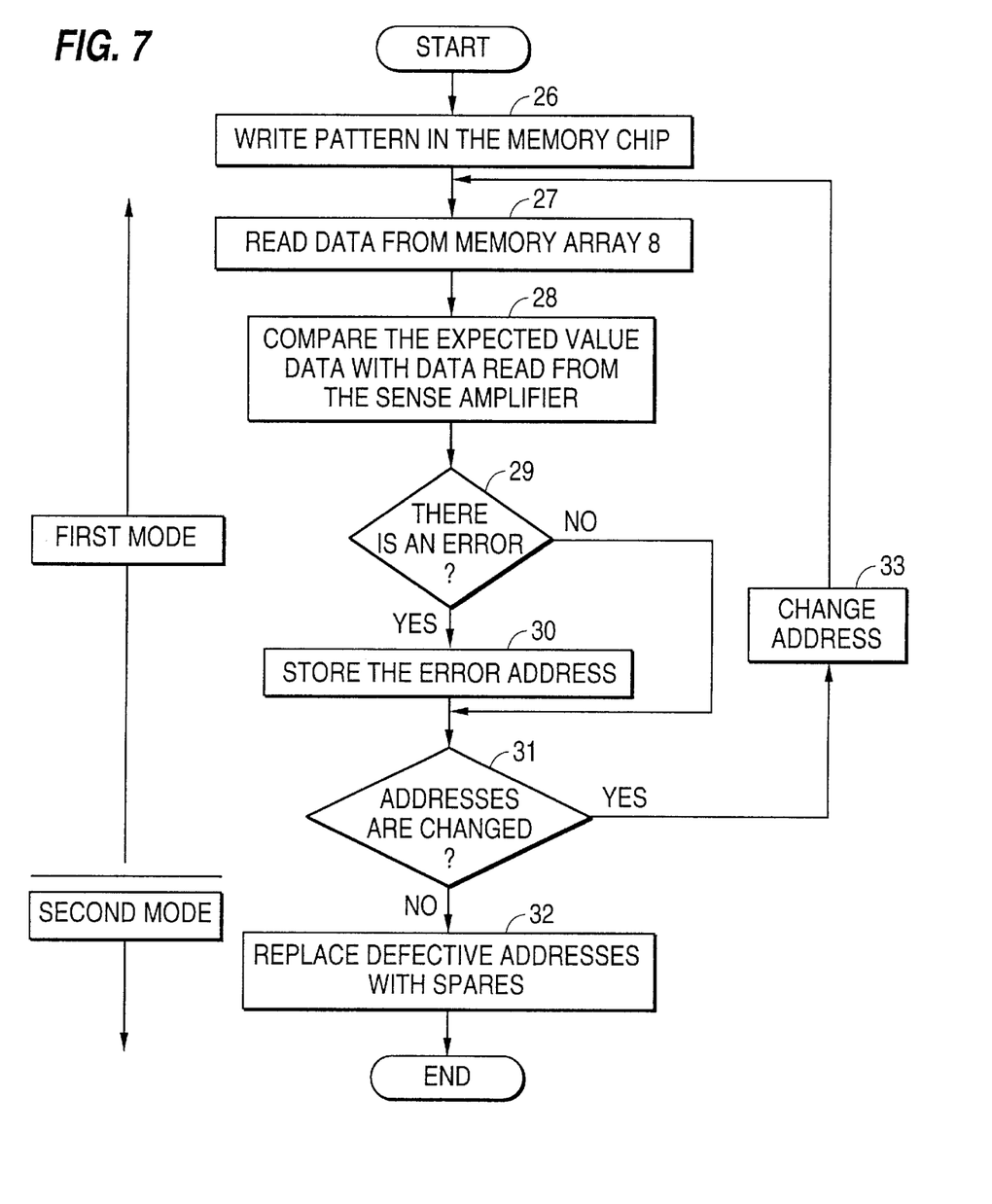
FIG. 7 is a flowchart of an operation sequence of the semiconductor memory device shown in FIG. 6.
Figure 8:
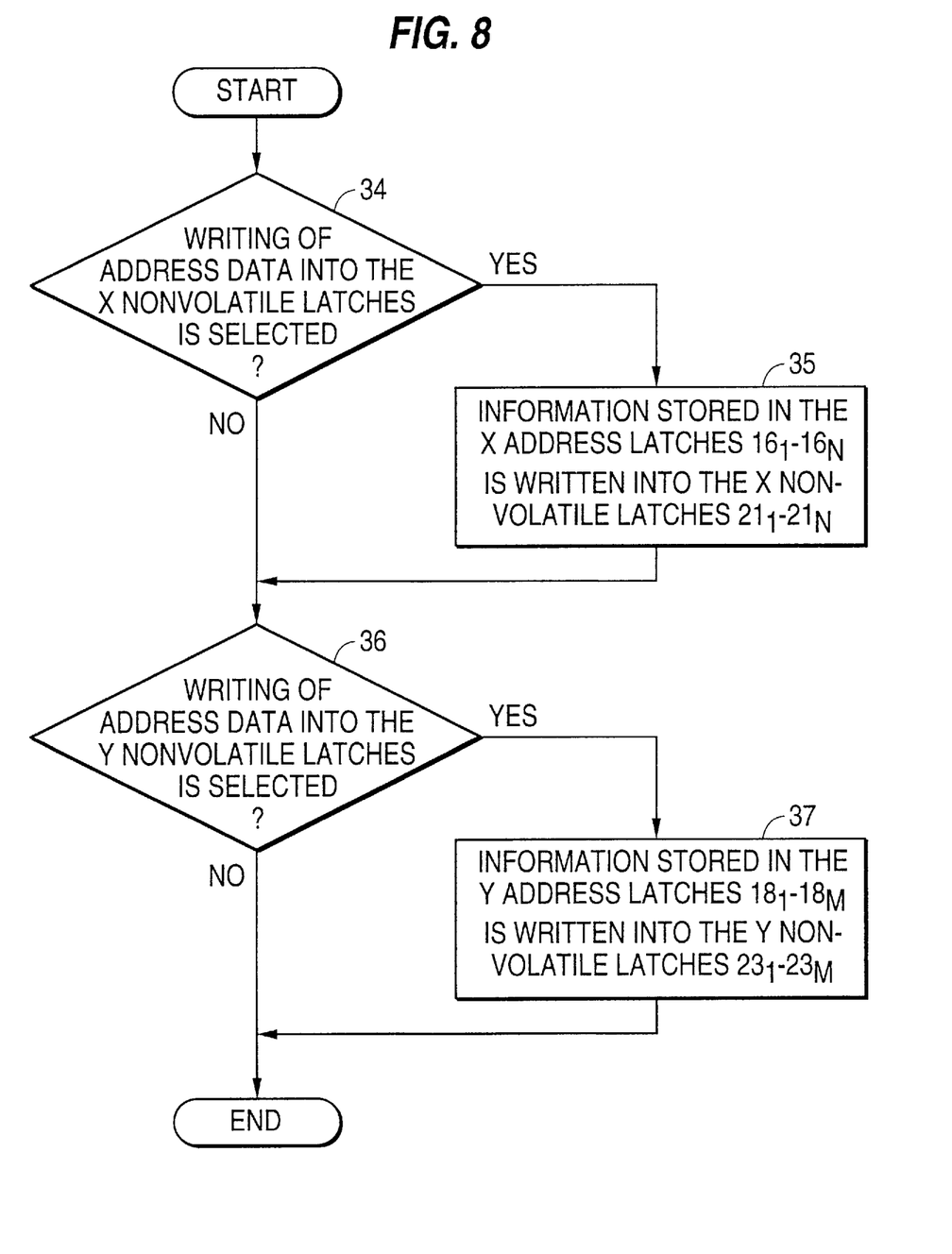
FIG. 8 is a flowchart of a detailed operation sequence of a step 32 of the operation sequence shown in FIG. 7.
Figure 9:
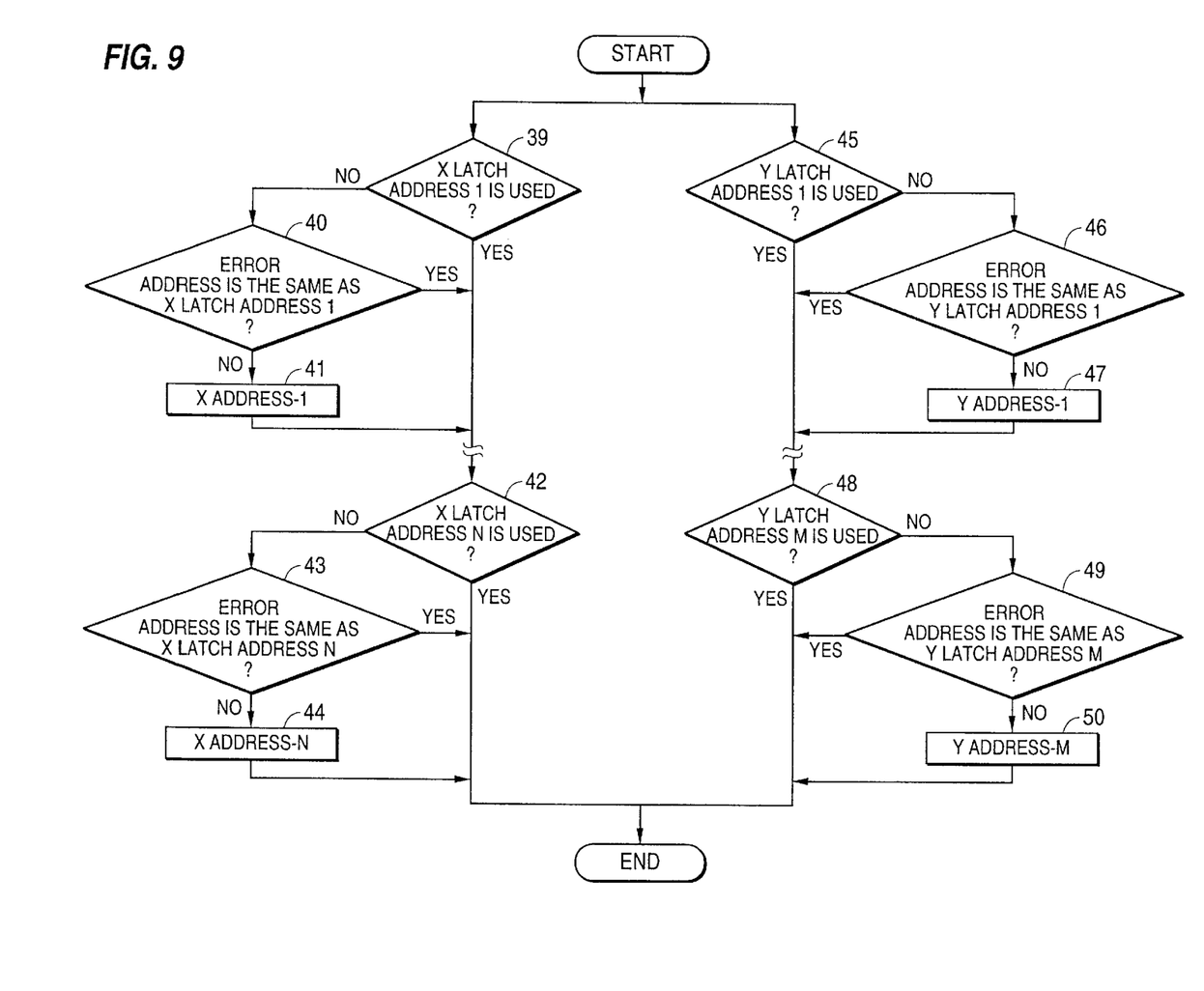
FIG. 9 is a flowchart of a detailed operation sequence of a step 30 of the operation sequence shown in FIG. 7.

Operation of the semiconductor memory device according to the first embodiment will be described below with reference to FIGS. 7, 8, and 9.

The semiconductor memory device operates in two modes, i.e., a first mode and a second mode. First, the first mode of operation will be described below. The first mode is selected when the level of the external signal /OE is of a high voltage. In response to the external signal /OE of a high voltage, the high-voltage detecting circuit 4 outputs a recognition signal indicating that the first mode is established to the control circuit 3. In response to the output signal from the high-voltage detecting circuit 4, the external signals /CE, /WE, and the first redundancy write control signal A, the control circuit 3 outputs the second redundancy write control signal B and the redundancy read control signal C. In the first mode, however, the second redundancy write control signal B is inactive. Since the second redundancy write control signal B is inactive, the nonvolatile latch write control circuit 20 which is supplied with the second redundancy write control signal B is not energized. Therefore, no data is latched in the X nonvolatile latches $21_1$~$21_N$ and the Y nonvolatile latches $23_1$~$23_M$ which include nonvolatile memory elements, i.e., no data is written in the nonvolatile memory elements of the X nonvolatile latches $21_1$~$21_N$ and the Y non-volatile latches $23_1$~$23_M$.

A pattern is written in the memory chip in a step 26, and the semiconductor memory device operates in the first mode to search for a defective address. Address information to be searched for and expected value data corresponding thereto are supplied from an external source to the external input terminal DIN for searching for a defective address. When an external address is supplied, the Y address buffer 1 generates an internal Y address and the X address buffer 2 generates an internal X address, and one memory element in the memory array 8 which is selected by the X decoder 9 and the Y decoder 7 is read by the sense amplifier 6. When the internal X address and data of the X nonvolatile latches $21_1$~$21_N$ which has been read into the redundancy control read circuit 25 agree with each other, an output signal from the address switching decision circuit 11 becomes active, and the X decoder 9 which is supplied with the output signal from the address switching decision circuit 11 selects a row line of a redundant memory cell. Similarly, when the internal Y address and data of the Y nonvolatile latches $23_1$~$23_M$ which has been read into the redundancy control read circuit 25 agree with each other, an output signal from the address switching decision circuit 11 becomes active, and the Y decoder 7 which is supplied with the output signal from the address switching decision circuit 11 selects a column line of a redundant memory cell. Then, the comparator 10 compares the expected value data outputted from the DC buffer 5, which corresponds to the address inputted from the external input terminal DIN, and data read from the sense amplifier 6 with each other in a step 28. If the compared data agree with each other, then an output signal from the comparator 10 is inactive, and the X latch control circuit 12 and the Y latch control circuit 14 do not operate. As a result, the X address latches and latch flag circuits $16_1$~$16_N$ and the Y address latches and latch flag circuits $18_1$–$18_M$ maintain their previous states. These address latches and latch flag circuits are reset when the first mode is established.

If the compared data do not agree with each other, then an output signal from the comparator 10 becomes active. As a result, the X latch control circuit 12 checks the states of the latch flags in the X address latches and latch flag circuits $16_1$~$16_N$ successively from the first X address latch and latch flag circuit $16_1$ to the Nth X address latch and latch flag circuit $16_N$, and simultaneously checks if a latch flag has already been set and the same address has been latched or not. If a latch flag has not first been set and the same address has not been present in all the latch circuits, then the data of the internal X address is latched through the X latch control circuit 12 into the latch where a latch flag has not first been set, and simultaneously a latch flag is set. Naturally, a first defective address after the first mode has been established is stored in the first X address latch and latch flag circuit $16_1$, and a latch flag is set. The address latches and latch flag circuits $18_1 \sim 18_M$ operate in the same manner as with the X address latches and latch flag circuits $16_1 \sim 16_N$. The X address latches and latch flag circuits $16_1 \sim 16_N$ and the Y address latches and latch flag circuits $18_1 \sim 18_M$ operate simultaneously with respect to a defective address in steps 29, 30, the step 30 being shown in detail in FIG. 9. Subsequently, the addresses are changed, and each time a defective address is found, it is read successively into the latch circuits in a step 33.

The second mode of operation will now be described below. The second mode is selected when a write voltage is applied to an external write voltage terminal and the level of the external signal /OE is of a high voltage. In response to the external signal /OE of a high voltage, the high-voltage detecting circuit 4 outputs a recognition signal indicating that the second mode is established to the control circuit 3. In response to the output signal from the high-voltage detecting circuit 4, the external signals /CE, /WE, and the first redundancy write control signal A, the control circuit 3 outputs the second redundancy write control signal B and the redundancy read control signal C. In the second mode, however, the redundancy read control signal C is inactive. Since the redundancy read control signal C is inactive, the redundancy control read circuit 25 which is supplied with the redundancy read control signal C is not energized. The first redundancy write control signal A is a control signal for selecting the writing of address data latched in the X address latches and latch flag circuits $16_1 \sim 16_N$ into the nonvolatile memory elements of the X nonvolatile latches $21_1 \sim 21_N$ or the writing of address data latched in the Y address latches and latch flag circuits $18_1 \sim 18_M$ into the nonvolatile memory elements of the Y nonvolatile latches $23_1 \sim 23_M$. The information of the first redundancy write control signal A is reflected in the second redundancy write control signal B. When the second mode is established, therefore, if the first redundancy write control signal A selects the writing of address data into the X nonvolatile latches $21_1 \sim 21_N$, the information stored in the X address latches and latch flag circuits $16_1 \sim 16_N$ is written through the nonvolatile latch write control circuit 20 into the nonvolatile memory elements of the X nonvolatile latches $21_1 \sim 21_N$, and if the first redundancy write control signal A selects the writing of address data into the Y nonvolatile latches $23_1 \sim 23_M$, the information stored in the Y address latches and latch flag circuits $18_1 \sim 18_M$ is written through the nonvolatile latch write control circuit 20 into the nonvolatile memory elements of the Y nonvolatile latches $23_1 \sim 23_M$ in steps 34, 35, 36, 37 (FIG. 8). Shifting from the first mode to the second mode needs to be carried out in a continuous sequence in order not to lose the latched address data.

Rather than the high-voltage detecting circuit 4 for establishing a mode of operation, data from an external output terminal may be read in response to a change of a signal applied to a control terminal, and a mode of operation may be established on the basis of the read data.

Figure 10:
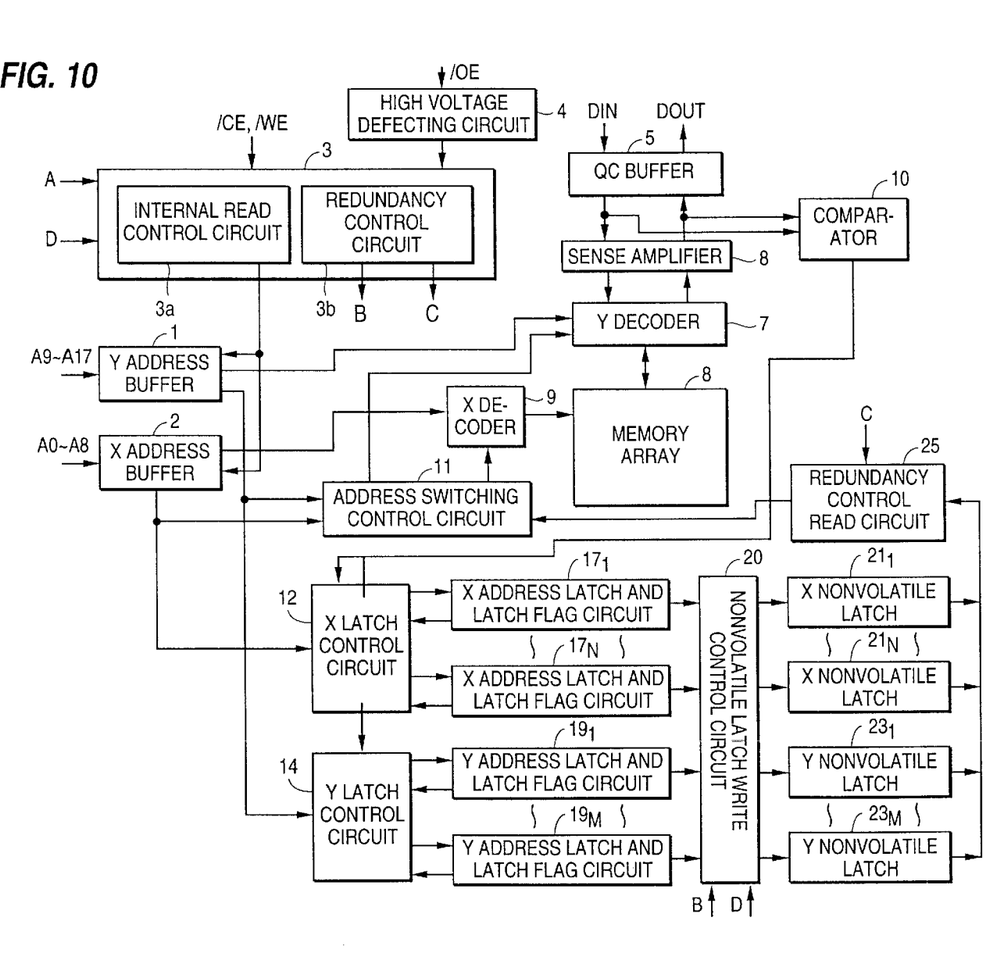
FIG. 10 is a block diagram of a semiconductor memory device according to a second embodiment of the present invention.

FIG. 10 shows in block form a semiconductor memory device according to a second embodiment of the present invention.

The semiconductor memory device according to the second embodiment is different from the semiconductor memory device according to first embodiment in that the control circuit 3 and the nonvolatile latch write control circuit 20 are supplied with a redundancy write control signal D in addition to the first redundancy write control signal A, and the X address latches and latch flag circuits $16_1 \sim 16_N$ are replaced with X address latches and NG count circuits $17_1 \sim 17_N$ and the Y address latches and latch flag circuits $18_1 \sim 18_M$ are replaced with Y address latches and NG count circuits $19_1 \sim 19_M$.

Operation of the semiconductor memory device according to the second embodiment will be described below.

The semiconductor memory device operates in two modes, i.e., a first mode and a second mode. First, the first mode of operation will be described below. The first mode is selected when the level of the external signal /OE is of a high voltage. In response to the external signal /OE of a high voltage, the high-voltage detecting circuit 4 outputs a recognition signal indicating that the first mode is established to the control circuit 3. In response to the output signal from the high-voltage detecting circuit 4, the external signals /CE, /WE, the first redundancy write control signal A, and the redundancy write control signal D, the control circuit 3 outputs the second redundancy write control signal B and the redundancy read control signal C. In the first mode, however, the second redundancy write control signal B is inactive. Since the second redundancy write control signal B is inactive, the nonvolatile latch write control circuit 20 which is supplied with the second redundancy write control signal B is not energized. Therefore, no data is latched in the X nonvolatile latches $21_1 \sim 21_N$ and the Y nonvolatile latches $23_1 \sim 23_M$ which include nonvolatile memory elements, i.e., no data is written in the nonvolatile memory elements of the X nonvolatile latches $21_1 \sim 21_N$ and the Y nonvolatile latches $23_1 \sim 23_M$. The semiconductor memory device operates in the first mode under these conditions.

A pattern is written in the memory chip in a step 26, and the semiconductor memory device operates in the first mode to search for a defective address. Address information to be searched for and expected value data corresponding thereto are supplied from an external source to the external input terminal DIN for searching for a defective address. When an external address is supplied, the Y address buffer 1 generates an internal Y address and the X address buffer 2 generates an internal X address, and one memory element in the memory array 8 which is selected by the X decoder 9 and the Y decoder 7 is read by the sense amplifier 6. When the internal X address and data of the X nonvolatile latches $21_1 \sim 21_N$ which has been read into the redundancy control read circuit 25 agree with each other, an output signal from the address switching decision circuit 11 becomes active, and the X decoder 9 which is supplied with the output signal from the address switching decision circuit 11 selects a row line of a redundant memory cell. Similarly, when the internal Y address and data of the Y nonvolatile latches $23_1 \sim 23_M$ which has been read into the redundancy control read circuit 25 agree with each other, an output signal from the address switching decision circuit 11 becomes active, and the Y decoder 7 which is supplied with the output signal from the address switching decision circuit 11 selects a column line of a redundant memory cell. Then, the comparator 10 compares the expected value data outputted from the DQ buffer 5, which corresponds to the address inputted from the external input terminal DIN, and data read from the sense amplifier 6 with each other. If the compared data agree with each other, then an output signal from the comparator 10 is inactive, and the X latch control circuit 12 and the Y latch control circuit 14 do not operate. As a result, the X address latches and NG count circuits $17_1 \sim 17_N$ and the Y address latches and NG count circuits $19_1 \sim 19_M$ maintain their previous states. These address latches and NG count circuits are reset when the first mode is established.

If the compared data do not agree with each other, then an output signal from the comparator 10 becomes active. As a result, the X latch control circuit 12 checks the states of the NG counts in the X address latches and NG count circuits $17_1 \sim 17_N$ successively from the first X address latch and NG count circuit $17_1$ to the Nth X address latch and NG count circuit $17_N$, and simultaneously checks if the same address has been latched or not. If an NG count is first 0 and the same address has not been present in all the latch circuits, then the data of the internal X address is latched through the X latch control circuit 12 into the latch where an NG count is first 0, and simultaneously (a NGs are count). Naturally, a first defective address after the first mode has been established is stored in the first X address latch and NG count circuit $17_1$, and an NG count is 1. The address latches and NG count circuits $19_1 \sim 19_M$ operate in the same manner as with the X address latches and NG count circuits $17_1 \sim 17_N$. The X address latches and NG count circuits $17_1 \sim 17_N$ and the Y address latches and NG count circuits $19_1 \sim 19_M$ operate simultaneously with respect to a defective address. Subsequently, the addresses are changed, and each time a defective address is found, it is read successively into the latch circuits.

The second mode of operation will now be described below. The second mode is selected when a write voltage is applied to an external write voltage terminal and the level of the external signal /OE is of a high voltage. In response to the external signal /OE of a high voltage, the high-voltage detecting circuit 4 outputs a-recognition signal indicating that the second mode is established to the control circuit 3. In response to the output signal from the high-voltage detecting circuit 4, the external signals /CE, /WE, the first redundancy write control signal A, and the redundancy write control signal D, the control circuit 3 outputs the second redundancy write control signal B and the redundancy read control signal C. In the second mode, however, the redundancy read control signal C is inactive. Since the redundancy read control signal C is inactive, the redundancy control read circuit 25 which is supplied with the redundancy read control signal C is not energized. The first redundancy write control signal A is a control signal for selecting the writing of address data latched in the X address latches and NG count circuits $17_1 \sim 17_N$ into the nonvolatile memory elements of the X nonvolatile latches $21_1 \sim 21_N$ or the writing of address data latched in the Y address latches and NG count circuits $19_1 \sim 19_M$ into the nonvolatile memory elements of the Y nonvolatile latches $23_1 \sim 23_M$. The redundancy write control signal D is a control signal which, when active, writes a latch address with a greatest NG count in the address latches and NG count circuits $17_1 \sim 17_N$, $19_1 \sim 19_M$ into the corresponding X nonvolatile latch. The redundancy write control signal D can freely be supplied from an external source.

The information of the first redundancy write control signal A and the redundancy write control signal D is reflected in the second redundancy write control signal B, with the redundancy write control signal D having priority over the first redundancy write control signal A. When the second mode is established, therefore, if the redundancy write control signal D is inactive and the first redundancy write control signal A selects the writing of address data into the X nonvolatile latches $21_1 \sim 21_N$, the information stored in the X address latches and NG count circuits $17_1 \sim 17_N$ is written through the nonvolatile latch write control circuit 20 into the nonvolatile memory elements of the X nonvolatile latches $21_1 \sim 21_N$, and if the redundancy write control signal D is inactive and the first redundancy write control signal A selects the writing of address data into the Y nonvolatile latches $23_1 \sim 23_M$, the information stored in the Y address latches and NG count circuits $19_1 \sim 19_M$ is written through the nonvolatile latch write control circuit 20 into the nonvolatile memory elements of the Y nonvolatile latches $23_1 \sim 23_M$. If the redundancy write control signal D becomes active, then a latch address with a greatest NG count in the address latches and NG count circuits $17_1 \sim 17_N$, $19_1 \sim 19_M$ into the corresponding X nonvolatile latch irrespective of the first redundancy write control signal A. This operation serves to add effective utilization of redundant memory cells.

Shifting from the first mode to the second mode needs to be carried out in a continuous sequence in order not to lose the latched address data.

While preferred embodiments of the present invention have been described using specific terms, such description is for illustrative purposes only, and it is to be understood that changes and variations may be made without departing from the spirit or scope of the following claims.

What is claimed is:

1. A semiconductor memory device comprising:
   a main memory array having memory elements for storing external data;
   a plurality of redundant memory cells for replacing defects in said main memory array;
   reading means for reading a memory element of said main memory array which corresponds to an external address;
   comparing means for comparing data read from said memory element with external expected value data corresponding to said external address;
   latch means for latching information of a portion of said external address if the data read from said memory element and said external expected value data do not agree with each other;
   writing control means for writing the information of the portion of said external address latched by said latch means into nonvolatile memory elements; and
   means for reading data from a redundant memory cell if said external address and the address, written in said nonvolatile memory elements, to be replaced by said redundant memory cell agree with each other.

2. A semiconductor memory device according to claim 1, wherein the semiconductor memory device is operable in a first mode for latching the portion of said external address if the data read from said memory elements and said external expected value data do not agree with each other, and a second mode for writing the data of said external address latched by said latch means into the nonvolatile memory elements.

3. A semiconductor memory device according to claim 1, wherein said writing control means becomes active when a level of a signal applied to an external terminal is of a high voltage.

4. A semiconductor memory device according to claim 1, wherein said writing control means is energized by particular data supplied from an output terminal in response to a negative-going edge supplied from a first external control terminal.

5. A semiconductor memory device according to claim 1, wherein said latch means comprises as many latch means as the number of said redundant memory cells.

6. A semiconductor memory device according to claim 2, wherein said nonvolatile memory elements include first nonvolatile memory elements for writing address data for repairing row lines and second nonvolatile memory elements for writing address data for repairing column lines, said writing control means comprising means for applying control signals to write the information of the portion of said external address into only said first nonvolatile memory elements and to write the information of the portion of said external address into only said second nonvolatile memory elements.

* * * * *